(12) United States Patent
Matsushita et al.

(10) Patent No.: US 7,462,312 B2
(45) Date of Patent: Dec. 9, 2008

(54) METHOD OF FABRICATING ELEMENT HAVING MICROSTRUCTURE

(75) Inventors: Naohisa Matsushita, Kawasaki (JP); Toshikazu Furui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 822 days.

(21) Appl. No.: 10/967,234

(22) Filed: Oct. 19, 2004

(65) Prior Publication Data

US 2005/0269731 A1    Dec. 8, 2005

(30) Foreign Application Priority Data

Jun. 7, 2004    (JP)    ............... 2004-168221

(51) Int. Cl.
*B29C 37/00*    (2006.01)
(52) U.S. Cl. ............... 264/160; 205/67; 205/70
(58) Field of Classification Search ............ 264/160; 205/67, 70, 75, 78, 79
See application file for complete search history.

(56) References Cited

U.S. PATENT DOCUMENTS

| 4,149,503 A | 4/1979 | Ozaki et al. |
| 5,013,693 A | 5/1991 | Guckel et al. |
| 5,501,784 A * | 3/1996 | Lessmollmann et al. ...... 205/67 |

FOREIGN PATENT DOCUMENTS

| JP | 59-17264 | 1/1984 |
| JP | 1-188308 | 7/1989 |
| JP | 7-114289 | 12/1995 |
| JP | 10-230429 | 9/1998 |
| JP | 2001-345533 | 12/2001 |

* cited by examiner

*Primary Examiner*—Mark Halpern
(74) *Attorney, Agent, or Firm*—Staas & Halsey LLP

(57) ABSTRACT

A method of fabricating an element having a microstructure such as an MEMS device uses a material whose state changes with a temperature change. A sheet-like member having a microstructure on its surface is fixed to a vacuum chuck by an adhesive sheet and the material whose state changes with a temperature change is applied to the surface of the sheet-like member the material is then cooled to solidify it on the surface of the sheet-like member and the sheet-like member is cut 10 into a plurality of elements, while the material is in the solidified state, and the separated elements are then removed from the adhesive sheet.

6 Claims, 5 Drawing Sheets

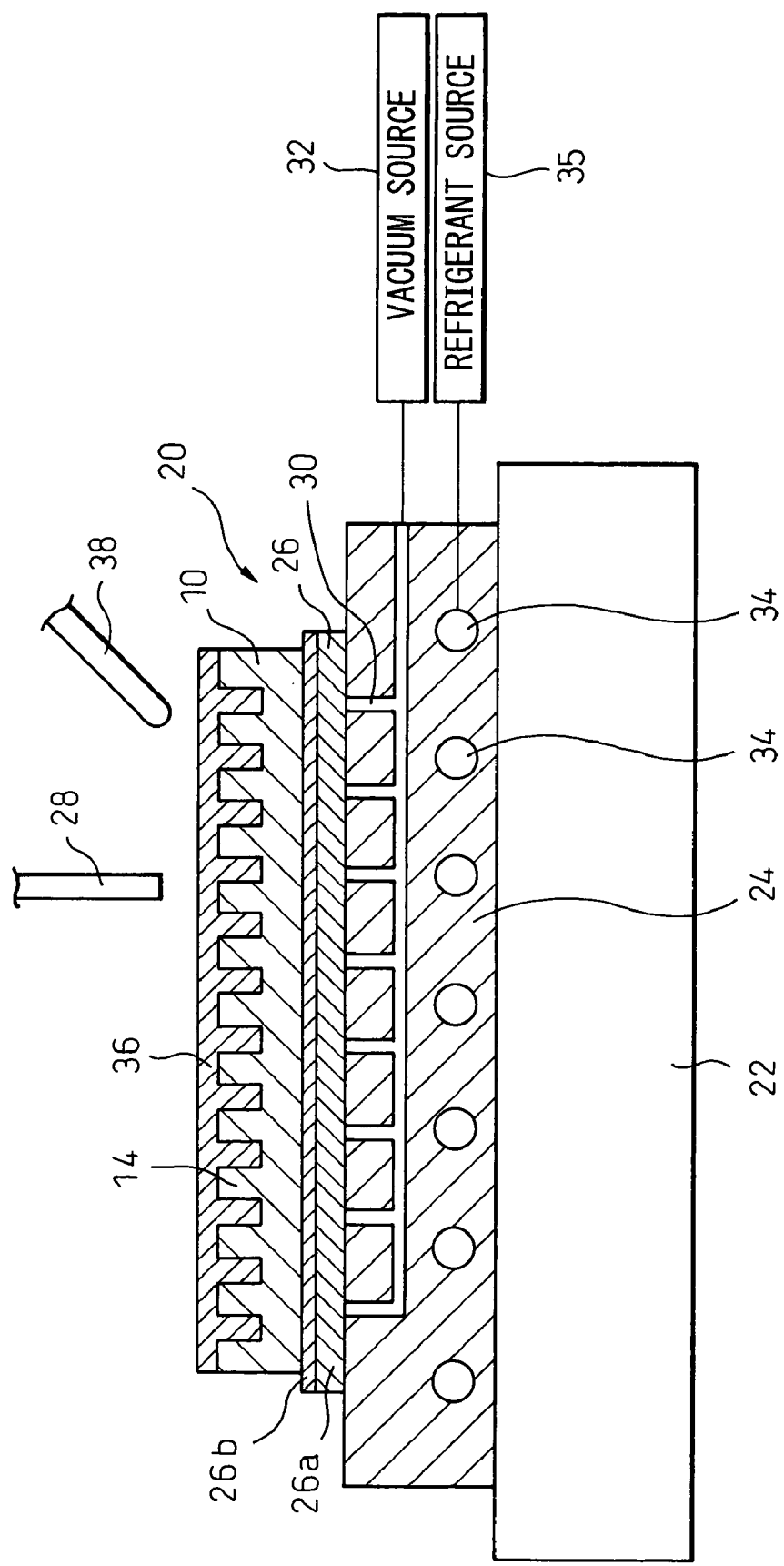

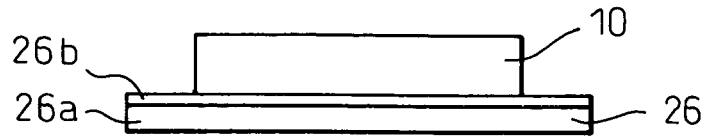
Fig.4A
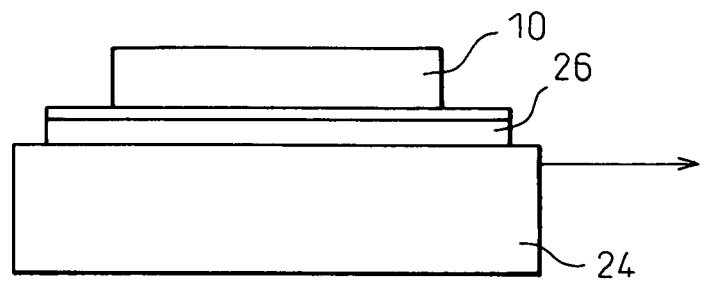
Fig.4B
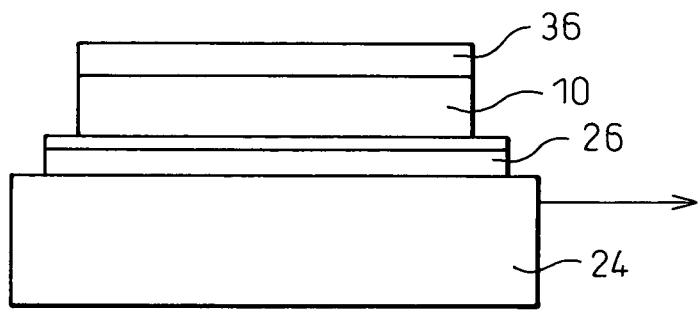
Fig.4C
Fig.4D
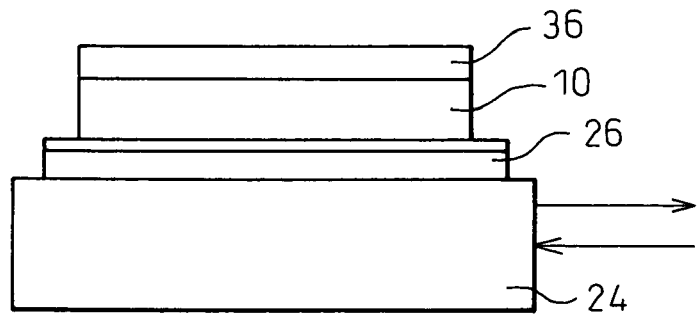

METHOD OF FABRICATING ELEMENT HAVING MICROSTRUCTURE

BACKGROUND OF THE INVENTION

1. Field of the Invention

The present invention relates to a method of fabricating an element having a microstructure.

2. Description of the Related Art

Elements having microstructures are known as micro-electronic devices. Japanese Examined Patent Publication (Kokoku) No. 7-114289 discloses an example of the micro-electronic device. An example of the element having a microstructure is an MEMS device that is applied to ultra-small optical switches, acceleration sensors, gyro-sensors, and so forth. The MEMS device comprises a substrate and a movable microstructure provided on the surface of the substrate (sheet-like member). Another example of the element having a microstructure is an element used in the radio frequency (RF) range. In the element used in the radio frequency (RF) range, a micro aerial wiring called "air bridge" is applied to the surface of the substrate (sheet-like member).

In the construction of the element having a microstructure, an electric circuit, etc, is formed in the sheet-like member, a microstructure is formed on the surface of the sheet-like member, and the sheet-like member is divided into a plurality of elements (chips) by a dicing operation using an abrasive blade. In the dicing, the sheet-like member is held by a vacuum chuck, or held by a vacuum chuck while it is fixed to an adhesive sheet, and is diced with the abrasive blade.

Dicing by use of the abrasive blade involves the problem that the element is likely to be damaged by mechanical vibration or impact. In the element having a microstructure, in particular, the microstructure formed on the surface of the substrate is likely to be damaged by vibration and impact.

The inventors of the present application have realized, specifically, conducting dicing while the microstructure formed on the surface of the substrate is protected or reinforced during production of the element having a microstructure.

Japanese Unexamined Patent Publication (Kokai) No. 59-17264, No. 2001-345533, No. 1-188308, and No. 10-230429 disclose a dicing method in which a semiconductor wafer is held by a vacuum chuck by using a refrigerated matter. The refrigerated matter is arranged in a tray-like holder having a cavity. The tray-like holder is fitted to the vacuum chuck. The semiconductor wafer is inserted into the cavity during use and a liquid such as water or silicone oil is charged. The liquid flows between the semiconductor wafer and the bottom surface of the cavity and is solidified when it is cooled (refrigerated). The semiconductor wafer is fixed to the vacuum chuck by the refrigerated matter so solidified and by the holder.

In this method, processing can be carried out safely, reliably and highly precisely without using an adhesive sheet. When the liquid such as water or silicone oil is applied to the surface of the semiconductor wafer, the liquid is solidified between the semiconductor wafer and the bottom surface of the cavity of the holder and also on the surface of the semiconductor wafer. Consequently, dicing can be carried out while the surface of the semiconductor wafer is covered with the refrigerated matter.

In this method, cooling is stopped after completion of dicing and the refrigerated matter is melted into the liquid. Therefore, individual elements can be removed from the holder. However, the individual elements are not held together and are separated one by one, so a problem develops when the individual elements are transferred to a subsequent process step. For example, it is difficult to automatically set the freely separated elements to a conveyor device and when the element is mounted to a substrate, an automatic mounting apparatus cannot be used.

SUMMARY OF THE INVENTION

It is an object of the present invention to provide a method of fabricating an element having a microstructure by which dicing can be carried out without imparting damage to the microstructure and cut elements can be taken out collectively.

A method of fabricating an element having a microstructure, according to the present invention, comprises the steps of fixing a sheet-like member having a microstructure on a surface thereof to a chuck with a holding member, applying a material the state of which changes with a temperature change to a surface of the sheet-like member, cooling the material to solidify it on the surface of the sheet-like member, cutting the sheet-like member into a plurality of elements while the material is in the solidified state, and removing the individual elements from the holding member.

According to this constitution, dicing can be conducted under the condition where the surface of the sheet-like member is covered with the solidified material and also under the condition where the material penetrates the interior of the microstructure on the surface of the sheet-like member and remains solidified, and therefore, the sheet-like member (and elements) having the microstructure is protected or reinforced by the solidified material during dicing, and damage of the microstructure can be prevented even when dicing uses an abrasive blade. Furthermore, a plurality of elements can be handled collectively while being held by the holding member after dicing is completed.

In this way, dicing can be carried out without imparting damage to the microstructure and a plurality of elements so diced can be collectively taken out. Therefore, an element having a microstructure having a stable function can be acquired and the production yield of the elements having the microstructure can be improved.

BRIEF DESCRIPTION OF THE DRAWINGS

FIG. 3 is a sectional view showing a dicing apparatus for cutting the sheet-like member;

FIGS. 4A to 4D are views explaining steps of a former half of a method of fabricating an element having a microstructure;

DESCRIPTION OF PREFERRED EMBODIMENTS

Figure 1:
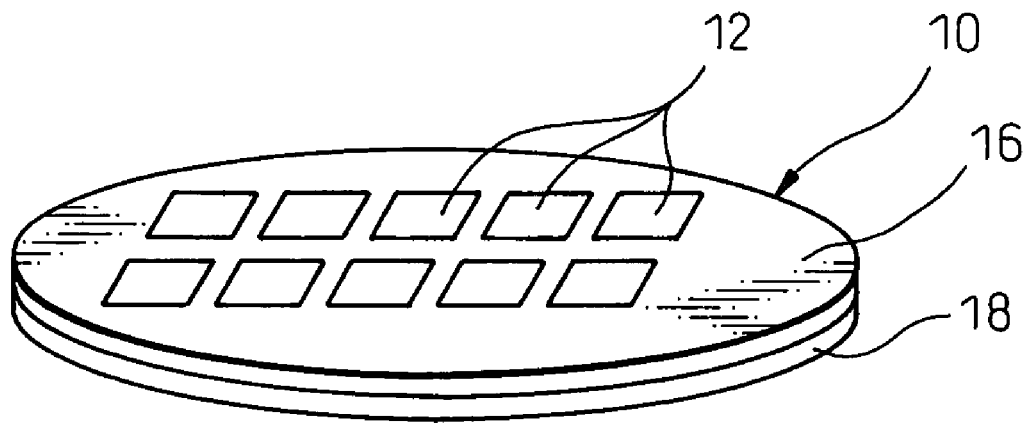
FIG. 1 is a perspective view showing an example of a sheet-like member for fabricating an element having a microstructure.
Figure 2:
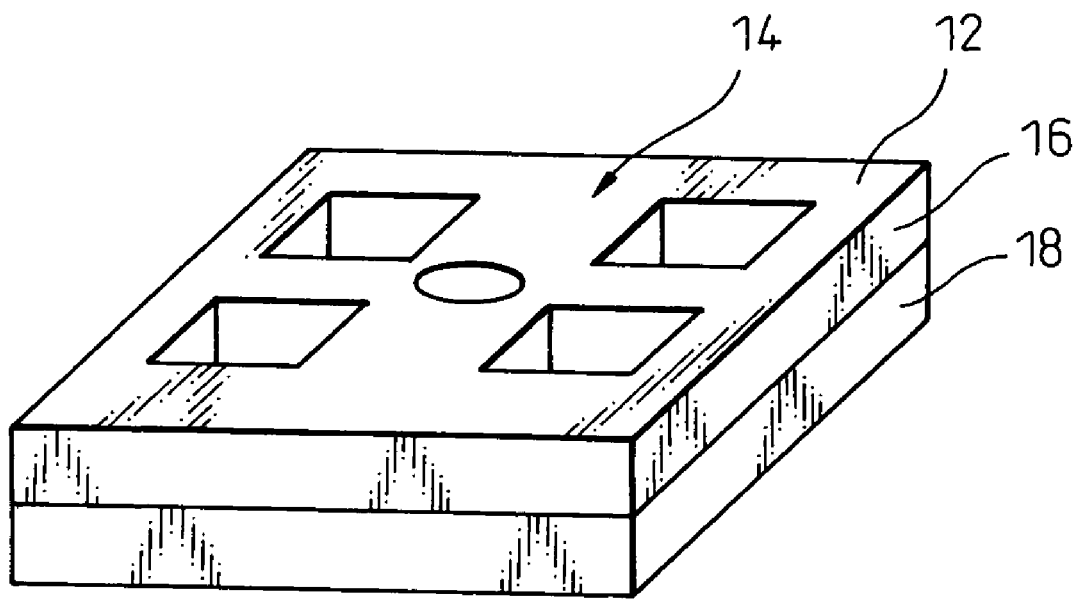
FIG. 2 is a perspective view showing the element having a microstructure and acquired by cutting the sheet-like member shown in FIG. 1.

Preferred embodiments of the present invention will be hereinafter explained with reference to the drawings. FIG. 1 shows an example of a sheet-like member for fabricating elements having a microstructure. FIG. 2 shows an element having a microstructure obtained by cutting the sheet-like member shown in FIG. 1. The present invention will be explained hereinafter about an MEMS device as an example of an element having a microstructure. However, the present invention is not limited to a method of fabricating the MEMS device but can be applied to the production of other devices having a microstructure.

Referring to FIG. 1, the sheet-like member 10 comprises a substrate which has a plurality of elements 12 having a microstructure built therein. An electric circuit, etc, is formed in the sheet-like member 10 and a movable microstructure is formed on the surface of the sheet-like member 10. The sheet-like member 10 is cut (diced) into a plurality of individual elements 12 having a microstructure. FIG. 2 shows one element 12 so diced. A microstructure 14 is formed on the surface of the element 12, and the microstructure 14 provides concavo-convexities to the surface of the element 12 (and to the surface of the sheet-like member 10). In the case of an MEMS device, the microstructure 14 includes a movable microportion. The sheet-like member 10 is formed of a substrate of a stacked structure comprising a silicon wafer 16 and a glass substrate 18.

FIG. 3 shows a dicing apparatus for cutting the sheet-like member 10. The dicing apparatus 20 includes a feed table 22, a vacuum chuck 24 fitted to the feed table 22, an adhesive sheet 26 vacuum-attracted by and fixed to the vacuum chuck 24 and an abrasive blade 28 for cutting the sheet-like member 10 which is fixed to the vacuum chuck 24 by the adhesive sheet 26. The adhesive sheet 26 comprises a base sheet 26a and an adhesive layer 26b applied to the base sheet 26a. The adhesive layer 26b is formed of an adhesive agent the tackiness of which can be lowered or lost upon irradiation with ultraviolet rays.

The vacuum chuck 24 has vacuum attraction grooves 30. The adhesive sheet 26 can be fixed to the vacuum chuck 24 when vacuum is introduced from a vacuum source 32 into the vacuum attraction grooves 30. The sheet-like member 10 is adhered to and held by the adhesive sheet 26 and is thus fixed to the vacuum chuck 24 by the adhesive sheet 26.

The vacuum chuck 24 further includes refrigerant ports 34. The vacuum chuck 24 can be cooled by supplying refrigerant from a refrigerant source 35 into the refrigerant ports 34, so that the sheet-like member 10 can be cooled through the vacuum chuck 24.

A material 36, the state of which changes with a temperature change, is applied to the surface of the sheet-like member 10. The material 36 comprises liquid such as water or silicone oil. When the liquid is cooled, the liquid is solidified into a solid, and when cooling is stopped, the solid is melted into the liquid. The material 36 is applied to the surface of the sheet-like member 10 from a nozzle 38, for example. However, the material 36 can be applied to the surface of the sheet-like member 10 by means other than the nozzle 38. As the microstructure 14 having the concavo-convexities is formed on the surface of the sheet-like member 10 as described above, the liquid material 36 not only covers the surface of the sheet-like member 10 but also penetrates the interior of the microstructure 14 on the surface of the sheet-like member 10. AS the material 36 is solidified under the condition where the material 36 permeates the microstructure 14 on the surface of the sheet-like member 10, the material 36 protects or reinforces the surface of the sheet-like member 10 so that the microstructure 14 does not move during dicing. Therefore, even when any vibration or impact occurs during dicing, the microstructure 14 is not damaged. Even when dicing is carried out while a large quantity of water is poured to remove cutting scraps and heat, the microstructure 14 is not damaged, either, by the impact of the water stream. This also holds true not only of the MEMS device but also of other devices having a microstructure such as one in which micro aerial wiring, called an "air bridge", is disposed and used in a radio frequency (RF) range, for example.

FIGS. 4A to 4D are views explaining the former half of process steps of the method of fabricating an element having a microstructure and FIGS. 5A to 5D are views explaining the latter half of the process subsequent to the process shown in FIGS. 4A to 4D. In FIG. 4A, the sheet-like member 10 is adhered to and held by the adhesive sheet 26. In FIG. 4B, the adhesive sheet 26 holding the sheet-like member 10 is fixed to the vacuum chuck 24. In this case, the adhesive sheet 26 holding the sheet-like member 10 is put on the vacuum chuck 24 and vacuum is introduced from the vacuum source 32 into the vacuum attraction grooves 30, thereby fixing the adhesive sheet 26 to the vacuum chuck 24.

In FIG. 4C, the material 36, the state of which changes with the temperature change, is applied to the surface of the sheet-like member 10 from the nozzle 38. In FIG. 4D, the refrigerant is supplied from the refrigerant source 35 to the refrigerant ports 34 to cool the vacuum chuck 24 and to thereby cool the sheet-like member 10 through the vacuum chuck 24. When the material 36 is silicone oil, for example, water is used for the refrigerant. When the material 36 is water, a refrigerant used in a refrigeration circuit is used as the refrigerant.

Figure 5A:
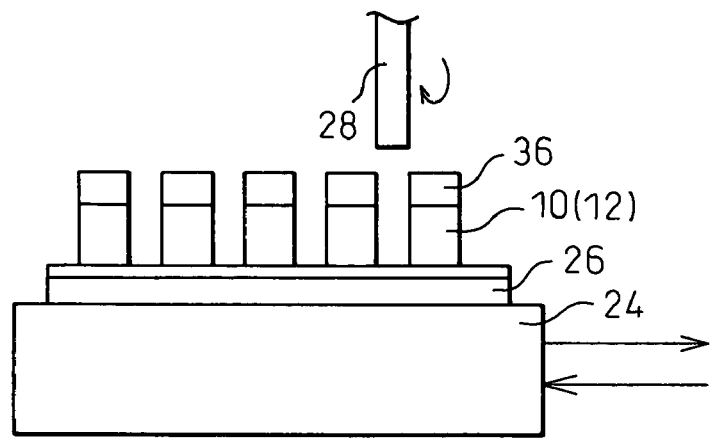
FIGS. 5A to 5D are views explaining steps of a latter half of the method subsequent to the steps shown in FIGS. 4A to 4D.

In FIG. 5A, the sheet-like member 10 is cut by the abrasive blade 28 into a plurality of individual elements 12 while the material 36 is in the solidified state. Dicing is carried out while the feed table 22 is moved and the abrasive blades 28 are rotated. At this time, the material 36 is solidified under the condition in which it covers the surface of the sheet-like member 10 and permeates the microstructure 14 of the surface of the sheet-like member 10, and consequently, the sheet-like member 10 (and the elements 12) having the microstructure is protected or reinforced during dicing and damage to the microstructure 14 can be prevented even when dicing uses the abrasive blade 28.

Figure 5B:
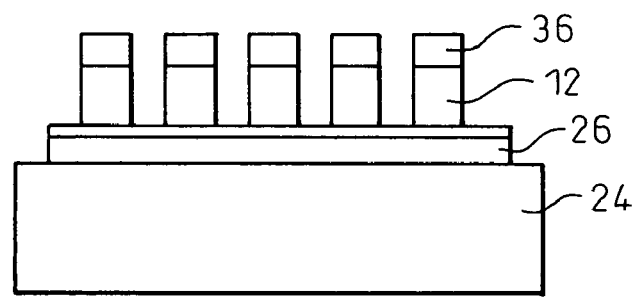

In FIG. 5B, after dicing is completed, cooling of the material 36 is stopped and the material 36 is thus melted. In other words, the supply of the refrigerant from the refrigerant source 35 to the refrigerant ports 34 is stopped and the temperature of the vacuum chuck 24 and the sheet-like member 10 is allowed to rise naturally to melt the material 36, and the material 36 is melted from the solid state into the liquid state.

Figure 5C:
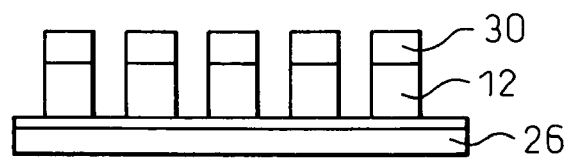
Figure 5D:
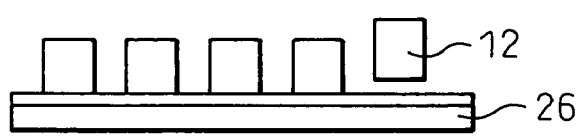

In FIG. 5C, the introduction of a vacuum into the vacuum attraction grooves 30 of the vacuum chuck 24 is stopped and the adhesive sheet 26 is released from the vacuum chuck 24. A plurality of elements 12 with the adhesive sheet 26 are removed from the vacuum chuck 24. Under this condition, too, a plurality of elements 12 remains fixed to the adhesive sheet 26 and are held in order on the adhesive sheet 26 without being freely separated one by one. In FIG. 5D, the elements 12 are dried at a suitable timing and the liquid material 36 is removed from the elements 12. In this way, after dicing is completed, a plurality of elements 12 can be taken out from the vacuum chuck 24 with the adhesive sheet 26 and can therefore be transferred collectively. Ultraviolet rays are thereafter irradiated to the adhesive sheet 26 to lower the bonding strength of the adhesive sheet 26 and the elements 12 can be removed one by one from the adhesive sheet 26.

Figure 6A:
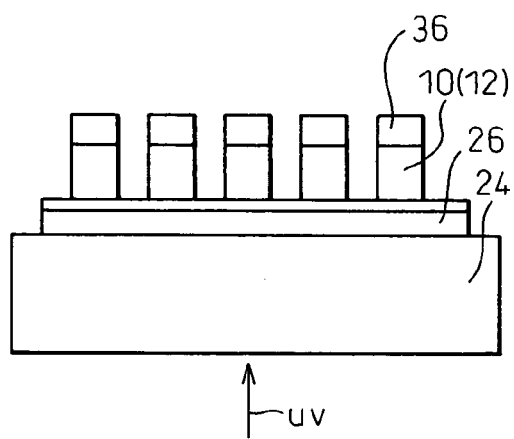
FIGS. 6A to 6E are views explaining another example of a method of fabricating an element having a microstructure.
Figure 6B:
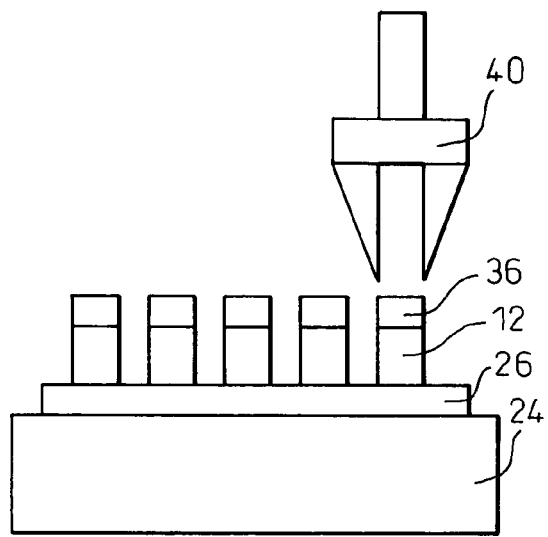
Figure 6C:
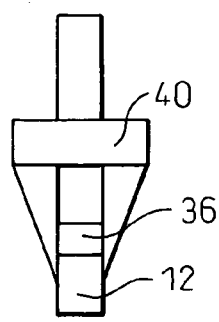
Figure 6D:
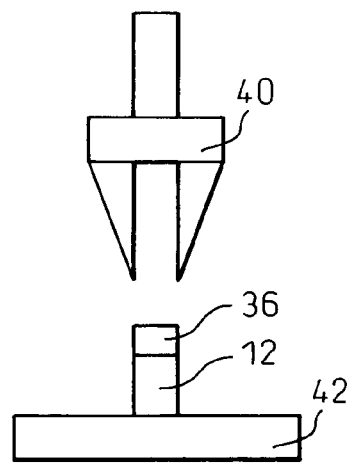
Figure 6E:
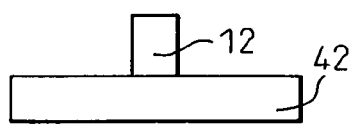

FIGS. 6A to 6E are views explaining another example of the method of fabricating an element having a microstructure. FIGS. 6A and 6E show the process steps after the steps from FIG. 4A to 5A are carried out. In other words, before the step shown in FIG. 6A, the sheet-like member 10 having the microstructure 14 on its surface is fixed to the vacuum chuck 24 (FIGS. 4A and 4B) by the adhesive sheet (holding member) 26, the material 36, the state of which changes with the temperature change, is applied to the surface of the sheet-like member 10 (FIG. 4C), the material 36 is cooled to solidify the material 36 on the surface of the sheet-like member 10 (FIG. 4D), and the sheet-like member 10 is cut into a plurality of individual elements 12 while the material 36 is in the solidified state.

In FIG. 6A, the vacuum chuck 24 is removed from the feed table 22 of the dicing apparatus 20 after the sheet-like member 10 is cut into a plurality of individual elements 12. The adhesive sheet 26 and the sheet-like member 10 are removed together with the vacuum chuck 24 from the feed table 22. The material 36 applied to the surface of the sheet-like member 10 remains solidified under this condition without melting. Therefore, the sheet-like member 10 can be handled without melting the material 36 applied to its surface.

The ultraviolet rays are irradiated under this condition to the adhesive sheet 26 through the vacuum chuck 24. Here, the vacuum chuck 24 is formed of a UV-permeable material. The bonding strength of the adhesive layer of the adhesive sheet 26 is lowered or lost upon irradiation of the ultraviolet rays.

In FIG. 6B, the elements 12 are removed from the adhesive sheet 26 by a handler 40 without melting the material 36 applied to the surface of the sheet-like member 10. Upon removable of the elements 12, the handler 40 having a cooling function is used, so that the element 12 can be transferred and mounted to a substrate while the material 36 on the surface of the element 12 is kept in the solidified state.

In FIG. 6C, the element 12 is transferred by the handler 40. In FIGS. 6D and 6E, the element 12 so transferred is mounted to a circuit substrate 42 by the handler 40. When the handler 40 releases the element 12, cooling naturally ends and the material 36 on the surface of the element 12 returns to the liquid. The element 12 may well be dried under this condition. In this way, after the sheet-like member 10 is cut into a plurality of individual elements 12, and the elements 12 are transferred to the subsequent step without stopping cooling of the material 36. Therefore, transfer and mounting can be carried out while the element 12 is protected or reinforced.

Because processing is executed while the movable microportion and the microstructure are fixed utilizing the material 36 the state of which changes from the liquid to the solid and vice versa with the temperature change and the sheet-like member 10 is fixed as a whole by the method or the material (adhesive sheet 26) different from the material 36, the separated elements 12 can be kept in the order in which the elements are initially arranged, and handling by using an automatic machine can be easily carried out.

Transfer and mounting can be carried out after completion of the processing while the material 36 around the movable microportion and the microstructure is kept in the solid state, so the movable microportion and the microstructure do not move due to vibration or impact occurring during handling, movement and mounting, whereby damage of the elements 12 does not occur. The material 36 fixing the movable microportion and the microstructure is thereafter returned to the liquid and is then dried.

As explained above, according to the present invention, an element such as an MEMS device or a device having a movable microportion or a micro aerial wiring can be fabricated without damaging the movable microportion and the micro aerial wiring during dicing step and the subsequent mounting step such as die bonding.

The invention claimed is:

1. A method of fabricating an element having a microstructure, comprising:
    fixing a sheet-like member having a microstructure on a first surface, to a chuck with a holding member arranged between a second surface of the sheet-like member and the chuck;
    applying a material in a liquid state on the first surface of said sheet-like member;
    cooling said material to change the liquid state of the material into a solid state on the first surface of said sheet-like member;
    cutting said sheet-like member into a plurality of elements while said material is in the solid state; and
    removing the individual elements from said holding member.

2. The method as defined in claim 1, wherein said holding member comprises an adhesive sheet.

3. The method as defined in claim 2, wherein after said sheet-like member is cut into the plurality of elements, said material is molten and said plurality of elements are transferred with said holding member.

4. The method as defined in claim 2, wherein after said sheet-like member is cut into said plurality of elements, said plurality of elements are transferred with said holding member while said material is in the solidified state.

5. The method as defined in claim 4, wherein said transferred elements are removed from said holding member and mounted while said material is in the solidified state.

6. A method of separating elements formed on a sheet-like substrate, comprising:
    fixing a first surface of the sheet-like substrate to a chuck;
    applying a material in a liquid state on a second surface of said sheet-like substrate, on which a plurality of microstructures have been formed;
    cooling said material to change the liquid state into a solid state;
    cutting said sheet-like member into a plurality of elements, each element including at least one microstructure, while said material is in the solid state on the second surface; and
    removing the elements from the chuck, wherein the material is removed from each of the elements by heating the material to change from the solid state into the liquid state.

* * * * *